(12) United States Patent
Tsui et al.

(10) Patent No.: US 7,341,941 B2
(45) Date of Patent: Mar. 11, 2008

(54) METHODS TO FACILITATE ETCH UNIFORMITY AND SELECTIVITY

(75) Inventors: Ting Y. Tsui, Garland, TX (US); Jeannette M. Jacques, Tallahassee, FL (US); Robert Kraft, Plano, TX (US); Ping Jiang, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 124 days.

(21) Appl. No.: 11/207,493

(22) Filed: Aug. 19, 2005

(65) Prior Publication Data

US 2007/0042599 A1    Feb. 22, 2007

(51) Int. Cl.
 *H01L 21/4763*    (2006.01)
(52) U.S. Cl. ................ 438/638; 438/705; 257/E21.577
(58) Field of Classification Search ........ 438/618–627, 438/633–639, 653, 677, 689, 694, 705, 707, 438/710, 723, 725; 257/E21.579, E21.583, 257/E21.584, E21.585, E21.575, E21.576, 257/E21.577
See application file for complete search history.

(56) References Cited

U.S. PATENT DOCUMENTS

| | | | |
|---|---|---|---|
| 6,831,005 B1 * | 12/2004 | Ross | ................ 438/633 |
| 6,893,985 B2 | 5/2005 | Goodner | |
| 6,909,195 B2 | 6/2005 | Li et al. | |
| 6,917,108 B2 | 7/2005 | Fitzsimmons et al. | |
| 2002/0084257 A1 * | 7/2002 | Bjorkman et al. | ............ 216/72 |
| 2002/0130416 A1 * | 9/2002 | Wang et al. | ................ 257/758 |
| 2002/0142577 A1 * | 10/2002 | Chung et al. | ............... 438/623 |

* cited by examiner

*Primary Examiner*—Brook Kebede
(74) *Attorney, Agent, or Firm*—W. James Brady, III; Frederick J. Telecky, Jr.

(57) ABSTRACT

A semiconductor device is fabricated with energy based process(es) that alter etch rates for dielectric layers within damascene processes. A first interconnect layer is formed over a semiconductor body. A first dielectric layer is formed over the first interconnect layer. An etch rate of the first dielectric layer is altered. A second dielectric layer is formed on the first dielectric layer. An etch rate of the second dielectric layer is then altered. A trench etch is performed to form a trench cavity within the second dielectric layer. A via etch is performed to form a via cavity within the first dielectric layer. The cavities are filled with conductive material and then planarized to remove excess fill material.

19 Claims, 8 Drawing Sheets

METHODS TO FACILITATE ETCH UNIFORMITY AND SELECTIVITY

FIELD OF INVENTION

The present invention relates generally to semiconductor devices and more particularly semiconductor fabrication methods that facilitate etch rate control and etch rate uniformity for deposited dielectric layers and damascene formation processes.

BACKGROUND OF THE INVENTION

In the manufacture of semiconductor products such as integrated circuits, individual electrical devices are formed on or in a semiconductor substrate, and are thereafter interconnected to form electrical circuits. Interconnection of these devices within an integrated circuit, also referred to as metallization, is typically accomplished by forming a multi-level interconnect network structure in layers formed over the electrical devices, by which the device active elements are connected to other devices to create the desired circuits. Conductive materials such as aluminum, aluminum-silicon alloys, copper, and the like, are employed to provide relatively low resistance connections between components and devices.

In one example of metallization, individual wiring layers within a multi-level network can be formed by depositing an insulating or dielectric layer over the discrete devices or over a previous interconnect layer, and patterning and etching contact openings such as vias. Conductive material, such as tungsten is then deposited into the vias to form inter-layer contacts. A conductive layer may then be formed over the dielectric layer and patterned to form wiring interconnections between the device vias, thereby creating a first level of basic circuitry. Dielectric material is then deposited over the patterned conductive layer, and the process may be repeated any number of times using additional wiring levels laid out over additional dielectric layers with conductive vias therebetween to form the multi-level interconnect network. This type of metallization is adequate for some conductive materials, such as aluminum. However, other conductive materials are not well suited to being patterned and thus, are not typically employed in the above metallization process.

Copper is a particularly desirable material for metallization because of its low resistivity (about 1.7 micro ohm-cm) and superior resistance to electromigration compared with aluminum and/or aluminum alloys. However, etching and patterning of copper is problematic. Copper patterning difficulties have been avoided or mitigated through the use of single and dual damascene interconnect processes in which cavities are formed (etched) in a dielectric layer. Damascene processing involves the creation of interconnect lines by first etching a trench or canal in a planar dielectric layer and then filling that trench with metal, such as aluminum or copper. In dual damascene processing, a second level is involved where a series of holes (contacts or vias) are etched and filled in addition to the trench. Thus, copper is deposited into the trenches and/or vias and over the insulative layer, followed by planarization using, e.g., a chemical mechanical polishing (CMP) process to leave a copper wiring pattern including the desired interconnect metal lines inlaid within the dielectric layer trenches and vias. In the single damascene process copper trench patterns or vias are created which connect to existing interconnect structures thereunder, whereas in a dual damascene process, both vias and the trenches are filled at the same time using a single copper deposition and a single CMP planarization. The advantage of damascene processing is that it eliminates the need for metal etch, which is advantageous for copper interconnects.

Conventional single and dual damascene interconnect processing typically includes the formation of via cavities through a dielectric layer, in which the via etch process stops on an etch-stop layer underlying the dielectric. In the single damascene case, an etch-stop layer etch process is then performed to expose the underlying structure, such as a conductive feature (e.g., silicide contact or copper feature) in a pre-existing interconnect layer. The via cavity is then filled with copper, an anneal is performed, and the wafer is planarized, after which further interconnect levels may then be fabricated. In the dual damascene case, a trench cavity is etched and an etch-stop layer etch is performed to expose the underlying structure. The via and trench cavities are simultaneously filled with copper, annealed, and the wafer is planarized thereby forming the copper interconnects and contacts.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention facilitates semiconductor device fabrication and, in particular, damascene formation, by selectively altering etch rates and etch rate uniformity for already formed dielectric layers. Energy based processes, such as ultraviolet processes or electron beam processes, are employed to strengthen molecular bonds within dielectric layers thereby altering (typically decreasing) etch rates and increasing etch rate uniformity. As a result, dielectric layers, even those formed with near identical initial etch rates, can be employed and uniformly etched without requiring etch stop layers by altering the etch rates for the dielectric layers.

In accordance with one aspect of the present invention, a method forms a semiconductor device with energy based process(es) that alter etch rates for dielectric layers within dual damascene processes. A first interconnect layer is formed over a semiconductor body. A first dielectric layer, such as an inter level dielectric layer, is formed over the first interconnect layer. An etch rate of the first dielectric layer is altered. A second dielectric layer, such as an inter metal dielectric layer, is formed on the first dielectric layer. An etch rate of the second dielectric layer is then altered. A trench etch is performed to form a trench cavity within the second dielectric layer. A via etch is performed to form a via cavity within the first dielectric layer. The cavities are filled with conductive material and then planarized to remove excess fill material.

In accordance with another aspect, a via etch is performed first. A first interconnect layer is formed over a semiconductor body. A first dielectric layer, such as an inter level dielectric layer, is formed over the first interconnect layer. An etch rate of the first dielectric layer is altered. A second dielectric layer, such as an inter metal dielectric layer, is formed on the first dielectric layer. An etch rate of the second dielectric layer is then altered. A via etch is performed to form a via cavity within the first dielectric layer and the second dielectric layer. A trench etch is then performed to form a trench cavity within the second dielectric layer. Next an etch-stop layer etch is performed to expose the underlying structure. The cavities are filled with conductive material and then planarized to remove excess fill material. Other devices and methods are disclosed.

The following description and annexed drawings set forth in detail certain illustrative aspects and implementations of the invention. These are indicative of but a few of the various ways in which the principles of the invention may be employed.

DETAILED DESCRIPTION OF THE INVENTION

Figure 1:
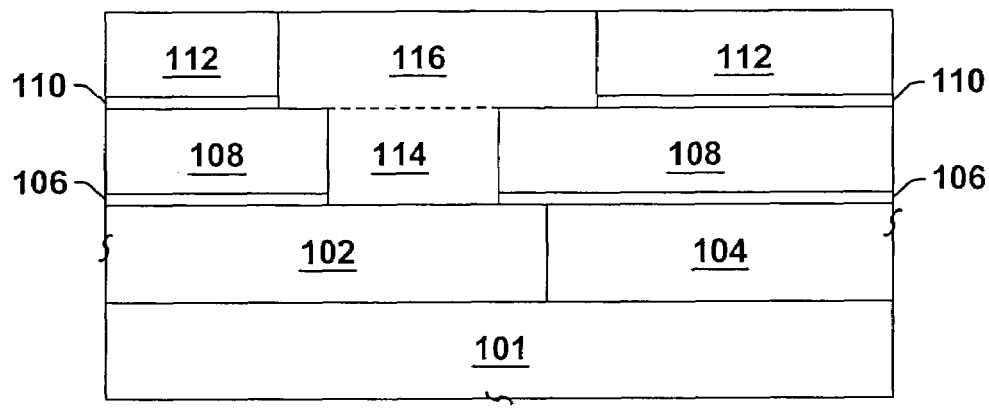
FIG. 1 is a cross sectional view of a convention semiconductor device fabricated with conventional damascene processes.

One or more implementations of the present invention will now be described with reference to the attached drawings, wherein like reference numerals are used to refer to like elements throughout, and wherein the illustrated structures are not necessarily drawn to scale. The invention provides transistor structures and methods in which transistor mobility is improved while reducing masks employed in fabrication thereof.

The inventors of the present invention appreciate that interconnection of devices, such as transistor devices, within an integrated circuit, also referred to as metallization, is typically accomplished by forming a multi-level interconnect network structure in layers formed over the electrical devices, by which the device active elements are connected to other devices to create the desired circuits. Conductive materials, such as, aluminum, aluminum-silicon alloys, copper, copper alloys, and the like, are formed within dielectric layers and are employed to provide relatively low resistance connections between components and devices.

Some conductive materials, such as copper, are not easily etched or patterned. For this reason and others, metallization layers are often formed by depositing a dielectric layer, such as an interlayer dielectric layer (ILD), and etching trench and/or via regions into which conductive material is deposited. Uniform and controlled etching of trench and/or via regions within the dielectric layers is generally required for formation of trenches and/or vias with proper shape, size, and thickness. Subsequently, a planarization process, such as chemical mechanical planarization (CMP), is performed which removes excess conductive material and leaves the conductive material within the trench and/or via regions to serve as lines, interconnects, and the like.

One problem encountered with conventional dielectric layers is that etch rates can be relatively non-uniform in various portions of the dielectric layers. As a result, depths of formed trench and/or via regions can be non-uniform thereby degrading device operation and performance.

One mechanism employed to obtain uniform etching of the dielectric layers is to employ an etch stop layer, which is formed prior to and underneath the deposited dielectric layers. Then, an etch process is performed with a selectivity to the etch stop layer thereby facilitating uniform formation of trench and/or via regions. Variations in etch rates for different portions of the dielectric layer are not substantially significant because of the presence of the etch stop layer. However, etch stop layers typically have higher k-values than typical deposited dielectric layers, which can result in higher than desired overall k values.

The present invention facilitates uniform etching of dielectric layers by controllably and/or selectively altering etch rates and increasing uniformity of etch rates for dielectric layers, particularly those employed in damascene processing. Blanket and/or selective curing processes are employed to selectively alter etch rates and increase uniformity of etch rates for dielectric layers, such as interlayer dielectric layers (ILD) and intermetal dielectric layers (IMD).

FIG. 1 is a cross sectional view of a convention semiconductor device 100 fabricated with conventional damascene processes. The device 100 includes a semiconductor body 101 having a semiconductor substrate and transistors and/or other devices formed therein. The semiconductor body 101 may also include one or more interconnect layers. One such layer is a metal interconnect 102 formed on the semiconductor body 101 and adjacent an insulative layer 104. The metal interconnect 102 is comprised of a conductive material, such as copper or can be a silicide region adjacent, for example, an underlying gate, source, or drain region.

A first etch stop layer 106 is formed over the semiconductor body 101 and the metal interconnect 102 and facilitates subsequent etching processes. Typically, the first etch stop layer 106 has a relatively low etch rate. An interlevel dielectric layer 108 is the formed on the first etch stop layer 106 by a suitable deposition process. The interlevel dielectric layer 108 is comprised of a dielectric material and has a higher etch rate than the first etch stop layer 106.

A second etch stop layer 110 is formed on the interlevel dielectric layer 108 and also facilitates subsequent etching processes. The second etch stop layer 110 also has a relatively low etch rate. An inter metal dielectric layer 112 is then formed on the second etch stop layer 110. The inter metal dielectric layer 112 is also comprised of a dielectric material and has a higher etch rate than the second etch stop layer 110.

A trench etch process is performed to form a trench cavity 116 within the inter metal dielectric layer 112. The trench etch process employs a suitable etch chemistry for a duration to selectively remove material from the inter metal dielectric layer 112 to form the trench cavity 116. A resist mask (not shown) is typically employed to facilitate the etch process. The second etch stop layer 110 has a lower etch rate than that of the inter metal dielectric layer 112 and, therefore, serves to mitigate over-etching into the underlying inter level dielectric layer 108. The second etch stop layer 110 mitigates damage from variations in etch rates typically present throughout such inter metal dielectric layers. An etch stop layer etch is then performed to remove a selected, exposed portion of the second etch stop layer.

A via etch process is then performed to form a via cavity 114 substantially within the inter layer dielectric layer 108. The via etch process also employs a suitable etch chemistry for a duration to selectively remove material from the inter layer dielectric layer 108 to form the via cavity 114. A second resist mask (not shown) is typically employed to facilitate the etch process. The first etch stop layer 106 has a lower etch rate than that of the inter level dielectric layer 108 and, therefore, serves to mitigate over-etching into the underlying metal interconnect 102. The first etch stop layer 106 mitigates damage from variations in etch rates typically present throughout such inter level dielectric layers. A second etch stop layer etch is then performed to remove a selected, exposed portion of the first etch stop layer and expose at least a portion of the metal interconnect 102.

A barrier layer (not shown) is typically formed on surfaces and inside walls of the via cavity 114 and trench cavity 116, and a seed layer (not shown) is typically formed on the barrier layer. Then, copper layer is deposited on the device, facilitated by the seed layer, so as to fill the trench cavity 116 and the via cavity 114. Note that since the size of all vias and trenches are not the same on a given metallization layer, sufficient copper deposition is employed to ensure that the biggest metallization features are adequately filled. Subsequently, a chemical mechanical planarization is performed to remove excess portions of the copper.

The presence of the etch stop layers 106 and 110 serve to mitigate non-uniformities in etch rates and prevent undesired over etching. However, etch stop layers generally have high-k values, particularly in comparison to low-k ILD and IMD layers, which increase an overall k-value for the device. As a result, a higher than desired capacitance can be obtained thereby degrading device performance. Often, to obtain a low enough overall k-value, the trench cavities are formed without the aid of etch stop layers. The following figure and discussion describe such a device and the problems encountered.

Figure 2:
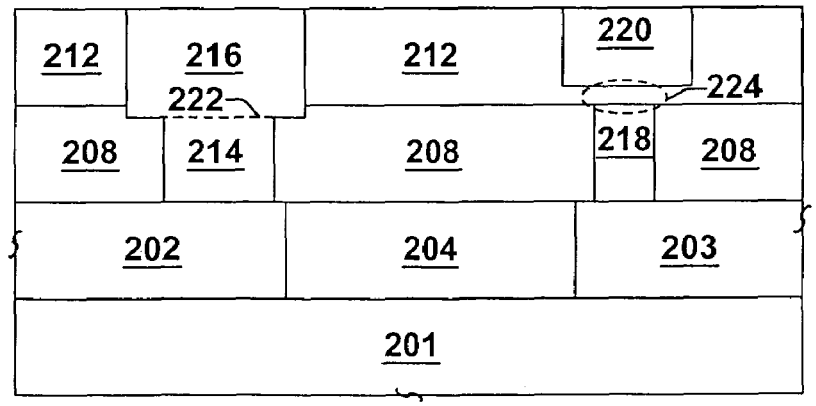
FIG. 2 is a cross sectional view of another semiconductor device fabricated with conventional damascene processes.

FIG. 2 is a cross sectional view of another semiconductor device 200 fabricated with conventional damascene processes. The device 200 includes a semiconductor body 201 having a semiconductor substrate and transistors and/or other devices formed therein. The semiconductor body 201 may also include one or more interconnect layers. One such layer includes a first metal interconnect 202 formed on the semiconductor body 201, an adjacent insulative layer 204, and a second metal interconnect 203. The metal interconnects 202 and 203 are comprised of a conductive material, such as copper or a silicide region adjacent, for example, an underlying gate, source, or drain region.

An inter level dielectric layer 208 is formed over the semiconductor body 201 and the metal interconnects 202 and 204. The interlevel dielectric layer 208 is comprised of a dielectric material. An inter metal dielectric layer 212 is then formed on the inter level dielectric layer 208. The inter metal dielectric layer 212 is also comprised of a dielectric material.

A trench etch process is performed to form trench cavities 216 and 220 within the inter metal dielectric layer 212. The trench etch process employs a suitable etch chemistry for a duration to selectively remove material from the inter metal dielectric layer 212 to form the trench cavities 216 and 220. A resist mask (not shown) is typically employed to facilitate the etch process. Without an etch stop layer, the trench etch process requires tight controls. Even minor variations in etch rate can cause over and/or under etching.

A via etch process is then performed to form via cavities 214 and 218 substantially within the inter layer dielectric layer 208. The via etch process also employs a suitable etch chemistry for a duration to selectively remove material from the inter layer dielectric layer 208 to form the via cavities 214 and 218. A second resist mask (not shown) is typically employed to facilitate the etch process.

A barrier layer (not shown) is typically formed on surfaces and inside walls of the via cavity 214 and trench cavity 216, and a seed layer (not shown) is typically formed on the barrier layer. Then, copper layer is deposited on the device, facilitated by the seed layer, so as to fill the trench cavity 216 and the via cavity 214. Note that since the size of all vias and trenches are not the same on a given metallization layer, sufficient copper deposition is employed to ensure that the biggest metallization features are adequately filled. Subsequently, a chemical mechanical planarization is performed to remove excess portions of the copper.

The device 200 avoids increased k-values by omitting etch stop layers within the device 200. As a result, a lower overall k-value can be obtained. However, variations in etch rate throughout the dielectric layers 208 and 212 can cause trench and/or via cavities to undesirably formed with varied depths. Additionally, the etch rates for the inter level dielectric layer 208 and the inter metal dielectric layer 212 are relatively close which also contribute to undesired variations in trench and via cavities depths. Costly tighter etch process controls may mitigate some of these variations, but undesired variations still occur.

Figure 3:
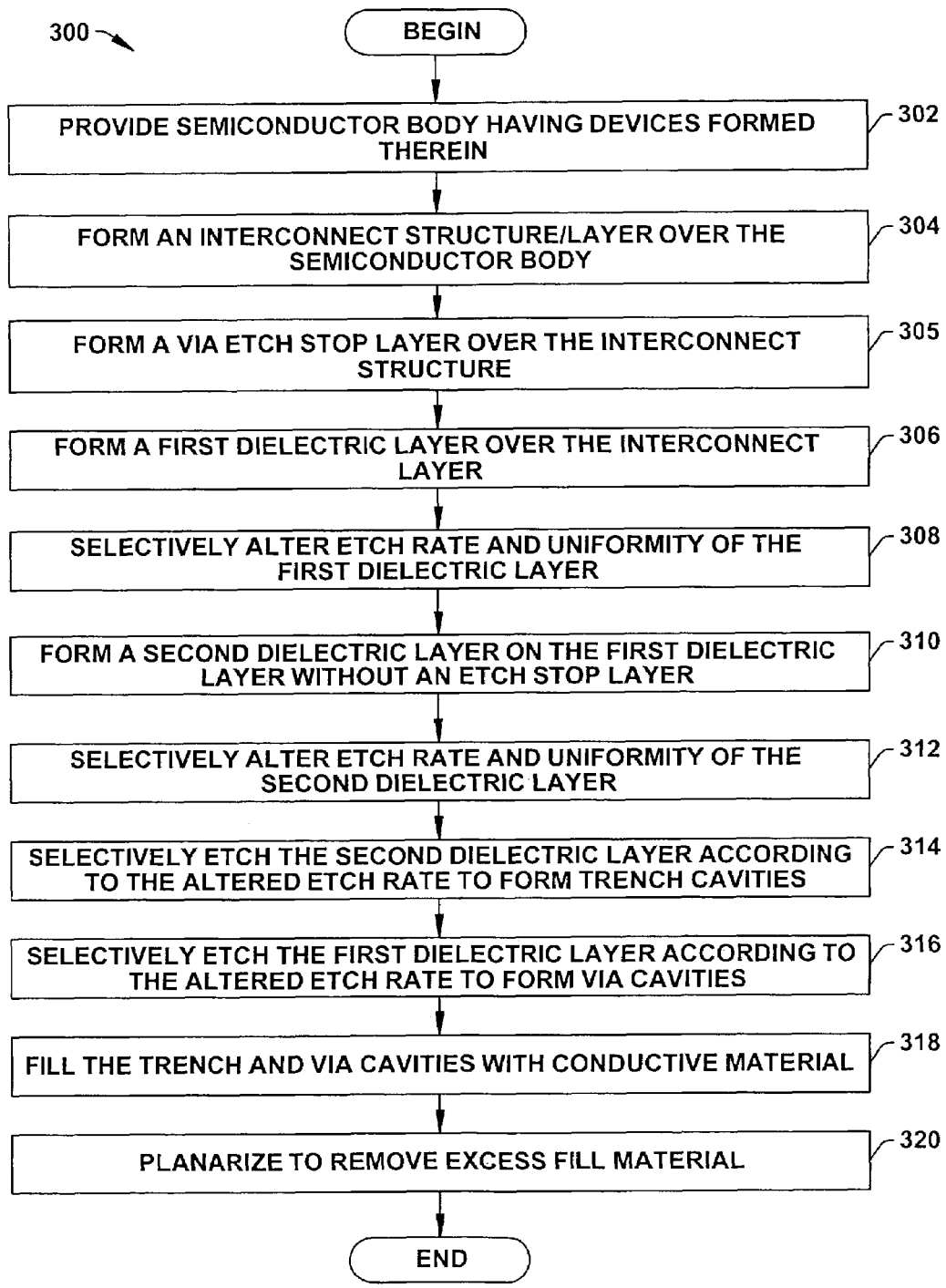
FIG. 3 is a flow diagram illustrating a method of fabricating a semiconductor device in accordance with an aspect of the present invention.

FIG. 3 is a flow diagram illustrating a method 300 of fabricating a semiconductor device in accordance with an aspect of the present invention. The method 300 forms the device without requiring a trench etch stop layer by altering etch rates and etch rate uniformity for dielectric layers.

The method 300 begins at block 302 wherein a semiconductor body is provided. The semiconductor body comprises a semiconductor substrate and transistor and/or other devices formed therein. An interconnect layer is formed over the semiconductor body at block 304. The interconnect layer comprises a metal interconnect, such as a silicide region or contact.

A via etch stop layer is then formed over the metal interconnect at block 305. The via etch stop layer is comprised of a relatively low etch rate material (such as silicon nitride, silicon carbide) and can also serve as a diffusion barrier, for example, to prevent Cu diffusion from underlying interconnect structures. However, it is appreciated that alternate aspects of the present invention include methods wherein forming a via etch stop layer is omitted.

A first dielectric layer, such as an interlevel dielectric layer, is formed over the interconnect layer and on the via etch stop layer at block 306. The first dielectric layer has an initial etch rate and may have etch rate variations throughout. The first dielectric layer is comprised of a suitable dielectric material, such as silicon dioxide, fluorine-doped silicate glass (FSG), organo-silicate glass (OSG), silsesquioxane (SSQ)-based materials, e.g., MSQ (methylsilsesquioxane) or hydrogensilsesquioxane (HSQ), and the like. Typically, but not necessarily, the first dielectric layer is comprised of a low-k dielectric material, for example, dielectric materials having a dielectric constant of about 3.2 or less. The first dielectric layer also has a suitable thickness, such as, for example, about 500 to 3,000 Angstroms.

Subsequently, the etch rate of the first dielectric layer is selectively altered at block 308. An energy based process is performed that breaks and then rebuilds bonds at an atomic level. As a result, the rebuilt bonds are stronger leading to a lowered and more uniform etch rate for the first dielectric layer. In one example, a dielectric layer has an initial etch rate of about 5,700 Angstroms/min and has an altered etch rate of about 3,300 Angstroms/min after being subjected to the energy process for a later performed etch process.

One example of a suitable energy based process is an electron beam process that directs electrons at the first dielectric layer. A dose for the electron beam process is in electrons per volume and the dose is selected to obtain a desired etch rate for the first dielectric layer. As an example, a cold cathode electron beam can be employed for the electron beam process. Some examples of suitable electron beam process parameters include operation temperatures from about room temperature to about 400 degrees Celsius, a pressure of about 0.01 mTmilli-torr, electron beam current of about 0.1 mA to 10 mA, a dose of about 50 to 10,000 micro-C/cm2, and time duration of about 5 seconds to about 60 minutes.

Another example of a suitable energy based process is an ultraviolet process that directs ultraviolet rays toward the first dielectric layer. A dose for the ultraviolet process is in energy per volume and is also selected to obtain a desired etch rate for the first dielectric layer. Some examples of suitable ultraviolet process parameters include UV power at about 6 kW (+/−5 kW) (depending upon chamber size, temperature from about room temperature to 450 degrees Celsius, pressure from about 0.01 mT to atmospheric, and a cure time from about 10 seconds to 60 minutes. Other suitable energy processes and process parameters can also be employed.

It is noted that the alteration of the etch rate at block 308 can be applied differently to different portions of the first dielectric layer. This can be achieved, for example, by performing multiple energy based processes in different locations of the first dielectric layer. One or more masks can be employed to facilitate varying the etch rate alterations in the different locations. Varied alterations of etch rates for different locations in the first dielectric layer can result in a more uniform etch rate by compensating for initial variations in etch rates of the different locations or portions of the first dielectric layer. Alternately, varied alterations of etch rates for different locations can result in varied etch rates in different portions of the first dielectric layer.

A second dielectric layer, such as an inter metal dielectric layer, is formed on the first dielectric layer at block 310. The second dielectric layer also has an initial etch rate and may have etch rate variations throughout. The initial etch rate for the second dielectric layer can be substantially similar to the initial etch rate for the first dielectric layer. The second dielectric layer is again comprised of a suitable dielectric material, such as silicon dioxide, fluorine-doped silicate glass (FSG), organo-silicate glass (OSG), silsesquioxane (SSQ)-based materials, e.g., MSQ (methylsilsesquioxane) or hydrogensilsesquioxane (HSQ), and the like. Typically, but not necessarily, the second dielectric layer is comprised of a low-k dielectric material, such as dielectric materials having a dielectric constant of about 3.2 or less. The second dielectric layer also has a suitable thickness, such as, for example, about 1,000 to 10,000 Angstroms.

The etch rate of the second dielectric layer is then selectively altered at block 312. An energy based process is performed that breaks and then rebuilds bonds at an atomic level. As a result, the rebuilt bonds are stronger leading to a lowered and more uniform etch rate for the first dielectric layer. Examples of suitable energy based processes that can be employed, including electron beam and ultraviolet based processes are described above.

The second alteration performed at block 312 alters the etch rate for the second dielectric layer, but also can further alter the etch rate for the first dielectric layer. Thus, the etch rate for the second dielectric layer is obtained according to a composition and/or formation process of the second dielectric layer, dose and time for the energy process at block 312 and the etch rate for the first dielectric layer is obtained according to a composition and/or formation process of the first dielectric layer and dose and time for the energy processes at block 308 and 312.

It is noted that the alteration of the etch rate at block 312 can be applied differently to different portions of the second dielectric layer as stated above with respect to the first dielectric layer. This can be achieved, for example, by performing multiple energy based processes in different locations of the first dielectric layer. One or more masks can be employed to facilitate varying the etch rate alterations in the different locations. Varied alterations of etch rates for different locations in the first dielectric layer can result in a more uniform etch rate by compensating for initial variations in etch rates of the different locations or portions of the first dielectric layer. Alternately, varied alterations of etch rates for different locations can result in varied etch rates in different portions of the first dielectric layer.

As a result of the etch rate alterations, the etch rate for the second dielectric layer is substantially different than the etch rate for the first dielectric layer. Typically, the etch rate for the second dielectric layer is much greater than the etch rate for the first dielectric layer, which facilitates subsequent etching and etch control. In one example, the etch rate of the second dielectric layer is twice that of the first dielectric layer.

A selective trench etch is performed at block 314 on the second dielectric layer to form trench cavities. A resist mask is typically employed to select target trench regions for etching. The trench etch is performed with a suitable etch chemistry, such as $C_4F_8$, for a selected time so as to remove exposed portions of the second dielectric layer thereby forming trench cavities. An example of a suitable etch process is a reactive ion etching process with $C_4F_8$ at about 5-15 sccm, $N_2$ at about 50-250 sccm, Ar at about 250-1000 sccm, pressure at about 30-200 mT, RF power at about 1,000 to 2,000 Watts, and electrode temperature of about 20-80 degrees Celsius. The trench etch is inherently selective to the first dielectric layer because of the differing etch rates of the layers.

A selective via etch is performed at block 316 on the first dielectric layer to form via cavities. The via etch is performed with a suitable etch chemistry, such as $C_4F_8$, for a selected time so as to remove an exposed portion of the first dielectric layer thereby forming via cavities. An example of a suitable etch process is a reactive ion etching process with $C_4F_8$ at about 5-15 sccm, $N_2$ at about 50-250 sccm, Ar at about 250-1000 sccm, pressure at about 30-200 mT, RF power at about 1,000 to 2,000 Watts, and electrode temperature of about 20-80 degrees Celsius. The via etch stop layer is employed to facilitate the etch process.

The via etch is more uniform than conventional via etch processes because of the selectivity of the second dielectric layer to the first dielectric layer has been increased with the etch rate alterations performed at block 308 and block 312.

The trench and via cavities are filled with a conductive material at block 318 to form conductive trench and via regions. It is appreciated that various trench and via cavities can have varying widths. As a result, enough fill material for the largest cavities is required to be deposited, so some cavities become overfilled.

A number of suitable processes can be employed to fill the cavities with conductive material. In one example, a metal barrier layer is formed on sidewalls and bottom surfaces of the trench and via cavities. The barrier layer can be deposited by a suitable process such as physical vapor deposition, chemical vapor deposition, or atomic layer deposition. Some examples of suitable materials for the barrier layer include, but are not limited to, tantalum, tantalum nitride, tantalum silicon nitride, titanium nitride, titanium silicon nitride, tungsten, tungsten nitride, tungsten silicon nitride, or contain ruthenium, iridium, or other binary or ternary compounds. In the case of physical vapor deposition for example, the deposition of the barrier layer is typically performed in an environment where the pressure is between about 0.5 and 50 mTorr, and a temperature between about 0 and 200 degrees Celsius to a thickness between about 10 and 500 angstroms.

A seed layer is optionally formed on the barrier layer, if present, or sidewalls and bottom surfaces of the cavities by depositing a relatively thin layer of conductive material (e.g., copper). The seed layer provides nucleation sites for subsequent deposition of copper and/or copper containing material. Thereafter, copper is formed on the seed layer at using a suitable copper deposition process. Some examples of suitable deposition mechanisms include electrochemical deposition (ECD), electroless deposition (e-less dep), chemical vapor deposition (CVD), and physical vapor deposition (PVD).

ECD, which is also referred to as electroplating, is performed in an electroplating system sometimes referred to as an ECD plating bath. If this mechanism is employed, the seed layer is formed on the device after the barrier layer is formed. Typically, the seed layer is deposited by CVD and/or PVD. The copper is then formed on the device, referred to as plating, by electrically coupling the device with a cathode/wafer holder in a reactor chamber or reservoir filled with electrolytic copper-containing fluid. A voltage is applied across the cathode/wafer holder and an anode via a power source to establish an electric field in the electrolytic fluid, causing migration and deposition of copper to the semiconductor device, particularly the seed layer, wherein the device operates as a cathode during the plating operation. The rate of copper deposition/plating is generally proportional to the current between the anode and cathode.

A planarization process is performed at block 320 to remove excess conductive material and electrically isolate conductive features formed in the trench and via regions. Additional metallization layers and/or packaging can subsequently be performed to complete fabrication of the semiconductor device.

It is appreciated that variations in the method 300 are contemplated in accordance with the present invention. For example, resist masks can be employed to alter only portions of the first and/or second dielectric layers. Additionally, etch stop layers can also be employed to further facilitate etching of the dielectric layers and formation of the cavities.

In particular, it is appreciated that variations in performing the etch processes can occur and still be in accordance with the present invention. For example, instead of performing the trench etch first, a via etch can be performed through both the first and second dielectric layers first followed by a trench etch of the second dielectric layer.

While, for purposes of simplicity of explanation, the method 300 is depicted and as executing serially. It is to be understood and appreciated that the present invention is not limited by the illustrated order, as some aspects could, in accordance with the present invention, occur in different orders and/or concurrently with other aspects from that depicted and described herein. Moreover, not all illustrated features may be required to implement a methodology in accordance with an aspect the present invention.

FIGS. 4A to 4K depict stages of fabrication for an exemplary semiconductor device formed in accordance with the method 300 of FIG. 3. The FIGS. 4A to 4K are exemplary in nature and are provided to facilitate understanding of the present invention and the method 300 of FIG. 3. It is appreciated that variations in structure, composition, dimensions, and the like for the device can occur and still be in accordance with the present invention.

Figure 4A:
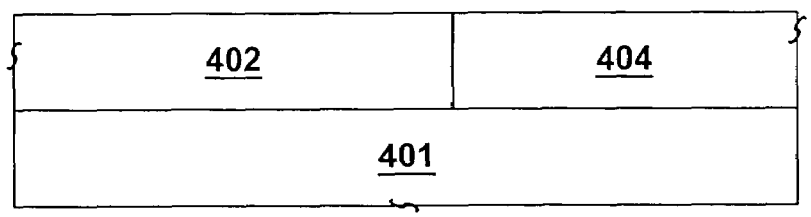
FIGS. 4A to 4K depict stages of fabrication for an exemplary semiconductor device formed in accordance with the method of FIG. 3.

FIG. 4A depicts a semiconductor device 400 at a stage of fabrication in accordance with an aspect of the present invention. A semiconductor body 401 is shown that comprises one or more layers of semiconductor materials, such as silicon, and transistors and/or other devices are formed therein. An interconnect layer is depicted as formed on the semiconductor body 401. The interconnect layer comprises a metal interconnect 402 and an insulative portion 404.

Figure 4B:
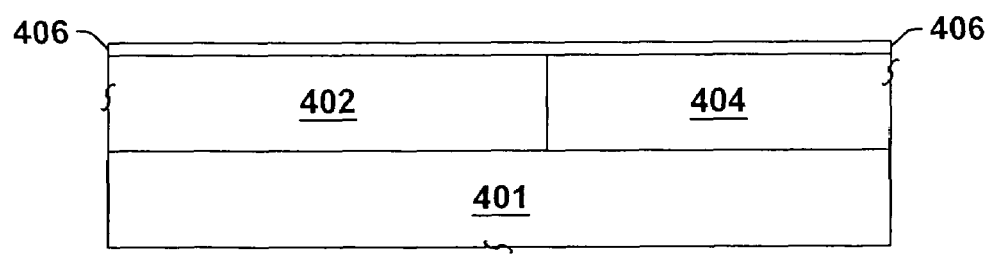

FIG. 4B depicts the semiconductor device 400 at another stage of fabrication in accordance with an aspect of the present invention. An etch stop layer 406 is formed to facilitate a subsequent via etch process. The etch stop layer 406 is comprised of a material that has a relatively low etch rate. It is noted that the method 300 and the present invention do not require a trench etch stop layer 406 and that a device can be fabricated in accordance with the present invention without an etch stop layer.

Figure 4C:
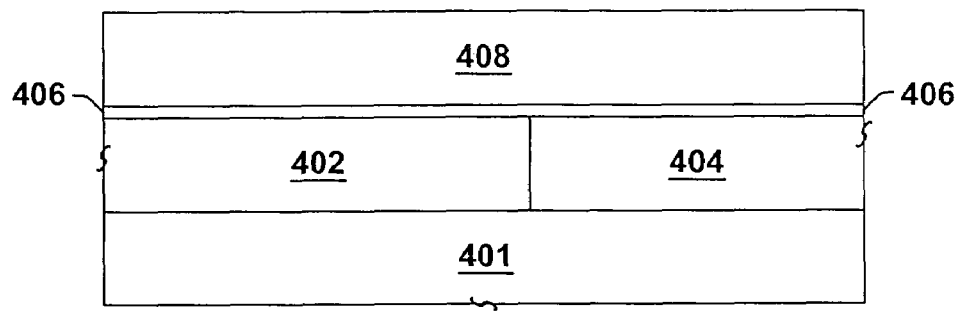

FIG. 4C depicts the semiconductor device 400 at yet another stage of fabrication in accordance with an aspect of the present invention. A first dielectric layer 408 is formed on the etch stop layer 406. The first dielectric layer 408 has an initial etch rate and can have variations in etch rate throughout. The first dielectric layer 408 is comprised of a suitable dielectric material, which is typically a low-k dielectric material. Some examples of suitable materials include silicon dioxide, fluorine-doped silicate glass (FSG), organo-silicate glass (OSG), silsesquioxane (SSQ)-based materials, e.g., MSQ (methylsilsesquioxane) or hydrogen-silsesquioxane (HSQ), and the like.

Figure 4D:
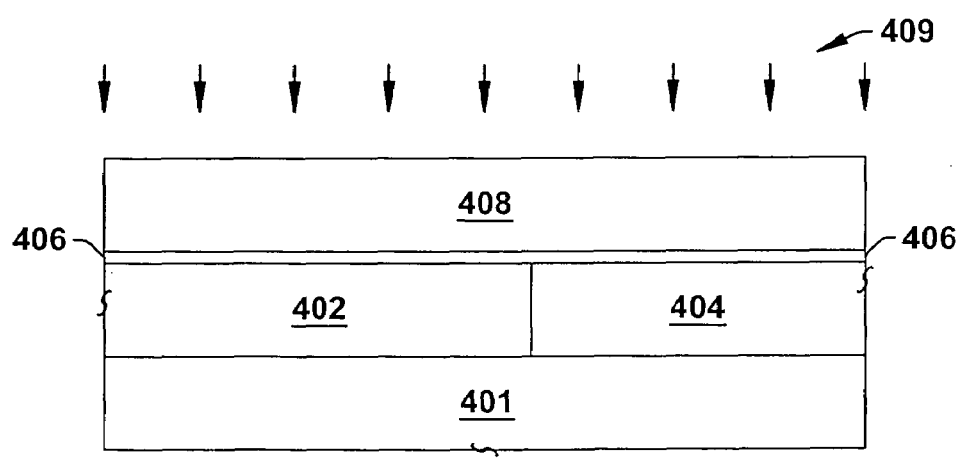

FIG. 4D illustrates the semiconductor device 400 at another stage of fabrication in accordance with an aspect of the present invention. An energy based process 409 is performed that alters the etch rate and etch rate uniformity of the first dielectric layer 408 and, optionally, the underlying etch stop layer 406. The energy based process 409 breaks bonds and then rebuilds bonds at an atomic level thereby creating stronger bonds. As a result, the rebuilt bonds are stronger leading to a lowered and more uniform etch rate for the first dielectric layer. One example of a suitable energy based process is an electron beam process that directs electrons at the first dielectric layer. A dose for the electron beam process is in electrons per volume and the dose is selected, along with a duration, to obtain a desired etch rate for the first dielectric layer. As an example, a cold cathode electron beam can be employed for the electron beam process. Some examples of suitable electron beam process parameters include operation temperatures from about room temperature to about 400 degrees Celsius, a pressure of about 0.01 mTmilli-torr, electron beam current of about 0.1 mA to 10 mA, a dose of about 50 to 10,000 micro-C/cm2, and time duration of about 5 seconds to about 60 minutes.

Another example of a suitable energy based process is an ultraviolet process that directs ultraviolet rays toward the first dielectric layer. A dose for the ultraviolet process is in energy per volume and is also selected to obtain a desired etch rate for the first dielectric layer. Some examples of suitable ultraviolet process parameters include UV power at about 6 kW (+/−5 kW) (depending upon chamber size, temperature from about room temperature to 450 degrees Celsius, pressure from about 0.01 mT to atmospheric, and a cure time from about 10 seconds to 60 minutes. Other suitable energy processes can also be employed.

Although illustrated as a blanket process, the energy based process 409 can be applied selectively to the first dielectric layer 408 in one or more processes in order to obtain varied etch rate alterations in different locations of the first dielectric layer 408.

Figure 4E:
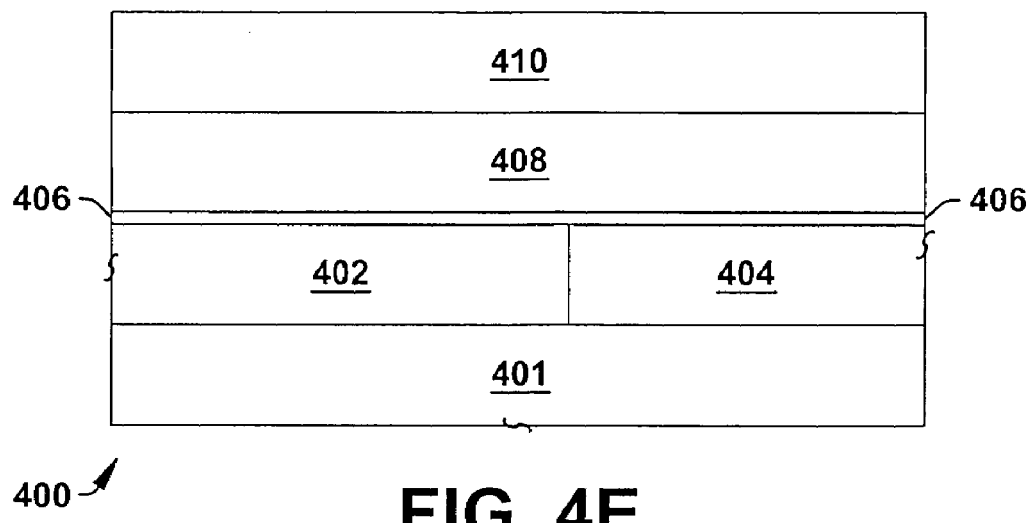

FIG. 4E depicts the semiconductor device 400 at yet another stage of fabrication in accordance with an aspect of the present invention. A second dielectric layer 410, such as an inter metal dielectric layer, is formed on the first dielectric layer 408. The second dielectric layer 410 also has an initial etch rate and may have etch rate variations throughout. The initial etch rate for the second dielectric layer 410 can be substantially similar to the initial etch rate for the first dielectric layer 408. The second dielectric layer 410 is similarly comprised of a suitable dielectric material, such as silicon dioxide, fluorine-doped silicate glass (FSG), organo-silicate glass (OSG), silsesquioxane (SSQ)-based materials, e.g., MSQ (methylsilsesquioxane) or hydrogensilsesquioxane (HSQ), and the like. Typically, but not necessarily, the second dielectric layer is comprised of a low-k dielectric material. Furthermore, the suitable dielectric material can be the same or varied form the dielectric material comprising the first dielectric layer.

Figure 4F:
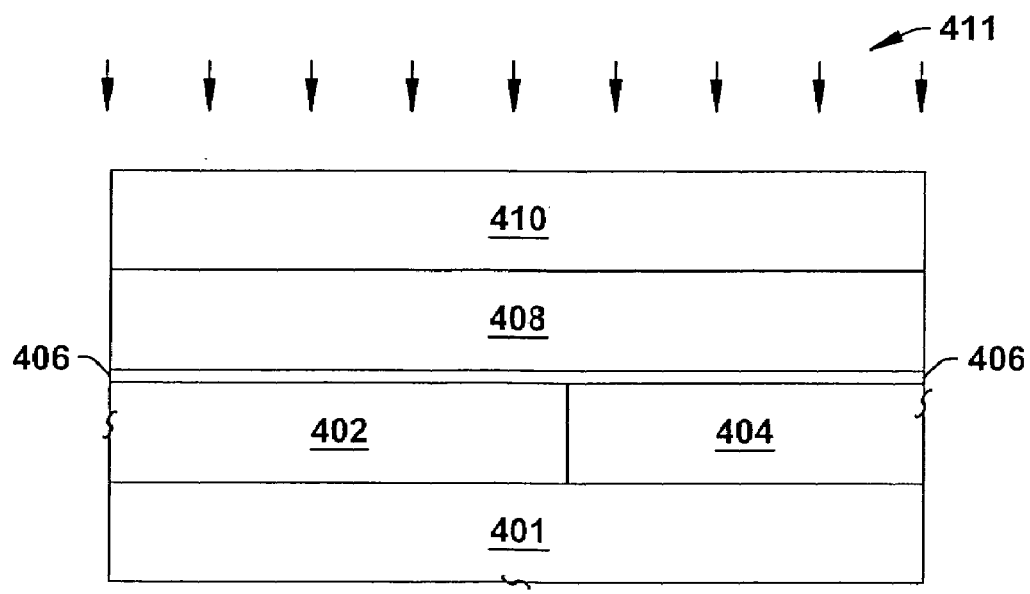

FIG. 4F illustrates the semiconductor device 400 at another stage of fabrication in accordance with an aspect of the present invention. A second energy based process 411 is performed that alters the etch rate and etch rate uniformity of the second dielectric layer 410 and, optionally, the underlying first dielectric layer 408 and/or the etch stop layer 406. Examples of suitable energy based processes that can be employed, including electron beam and ultraviolet based processes are described above.

Although illustrated as a blanket process, the energy based process 411 can be applied selectively to the second dielectric layer 410 in one or more processes in order to obtain varied etch rate alterations in different locations of the first dielectric layer 408. The varied alteration of etch rates for different locations of the dielectric layers can be employed to obtain a more uniform etch rate for dielectric layers with known initial variations. Additionally, the varied alteration of etch rates can be employed to obtain non-uniform etch rates for different locations within the dielectric layers.

The altered etch rates for the first dielectric layer and the second dielectric layer are typically altered so as to be substantially different, thereby increasing selectivity. Generally, the etch rate for the second dielectric layer 410 is substantially greater than the etch rate for the first dielectric layer. In one example, the etch rate of the second dielectric layer 410 is twice that of the first dielectric layer 408. Thus, for example, if the first dielectric layer 408 has an etch rate (for a particular etch process) of about 2,500 Angstroms/min, the second dielectric layer 410 has an etch rate of about 5,000 Angstroms/min. This difference in etch rates facilitates selectivity of subsequent etch processes.

Figure 4G:
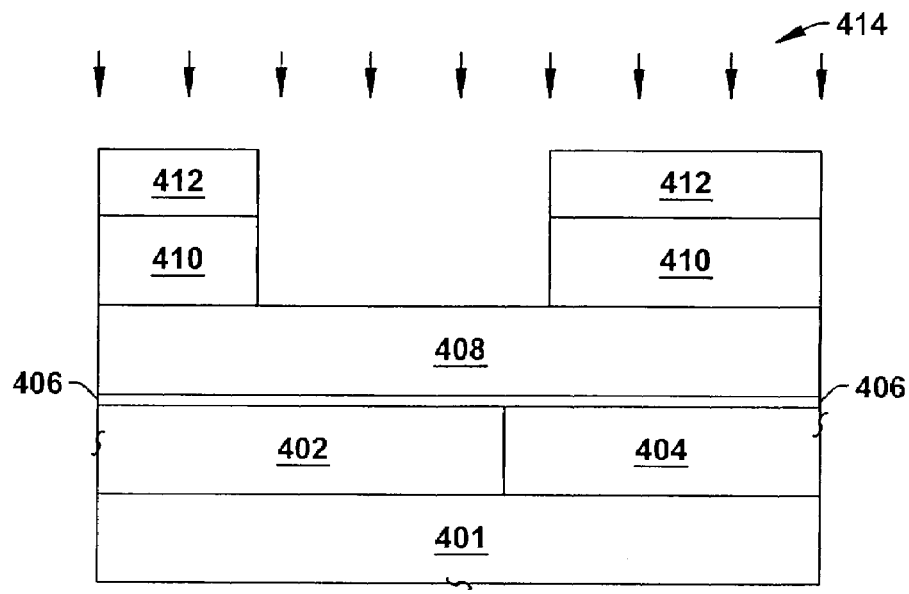

FIG. 4G depicts the semiconductor device 400 at yet another stage of fabrication in accordance with an aspect of the present invention. In this stage, a trench etch 414 is performed that forms a trench cavity within the second dielectric layer 410.

A trench mask 412 is formed over the device 400 that selectively exposes a target trench region. The trench mask 412 is comprised of a material, such as photoresist. The trench etch 414 is performed with a suitable etch chemistry for a selected time so as to remove exposed portions of the second dielectric layer 410 thereby forming the trench cavity. The trench etch 414 is selective to the first dielectric layer 408 because of the different etch rates. Subsequently, the trench mask 412 is removed by, for example, an ashing process. Typical etch rate non-uniformity from a trench etch on an RIE etcher is 5-10%. By treating the dielectric films with energy based processes, such as ultraviolet or electron beam processes, the etch rate non-uniformity can be reduced to 2-3%. As a result, metal sheet resistance control is tightened and device performance is improved.

Figure 4H:
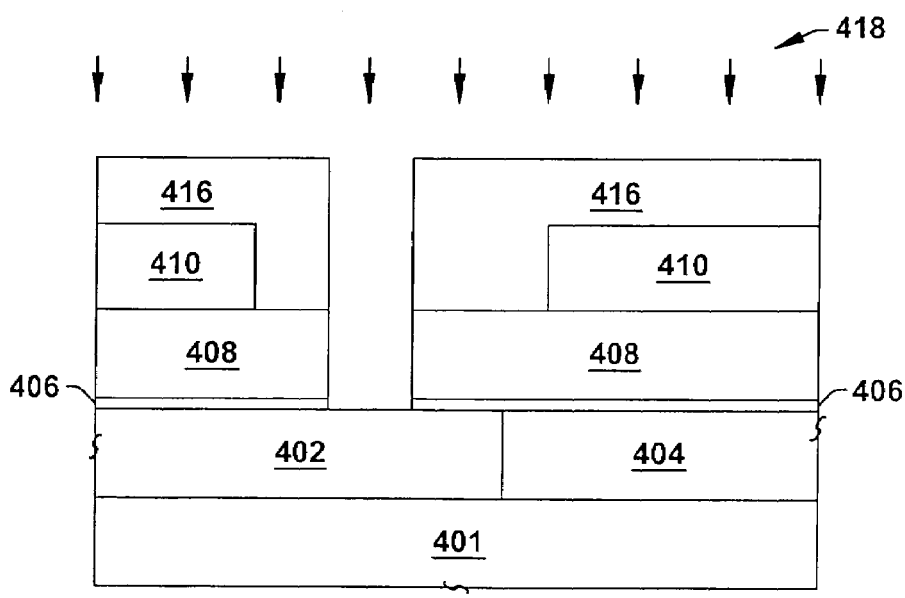

FIG. 4H depicts the semiconductor device 400 at another stage of fabrication in accordance with an aspect of the present invention. In this stage, a via etch 418 is performed that forms a via cavity within the first dielectric layer 408.

A via mask 416 is formed over the device 400 that selectively exposes a target via region. The via mask 416 is also comprised of a suitable material, such as photoresist. The via etch 418 is performed that selectively etches the first dielectric layer 408 to form a via cavity. The via etch 418 is performed with a suitable etch chemistry for a selected time so as to remove an exposed portion of the first dielectric layer thereby forming the via cavity.

It is noted that FIGS. 4G and 4H depict formation of the trench cavity prior to formation of the via cavity. However, it is noted that the present invention also includes forming the via cavity prior to the formation of the trench cavity. For example, instead of performing the trench etch first, a via etch can be performed through both the first dielectric layer 408 and the second dielectric layer 410 first followed by a trench etch of the second dielectric layer.

Figure 4I:
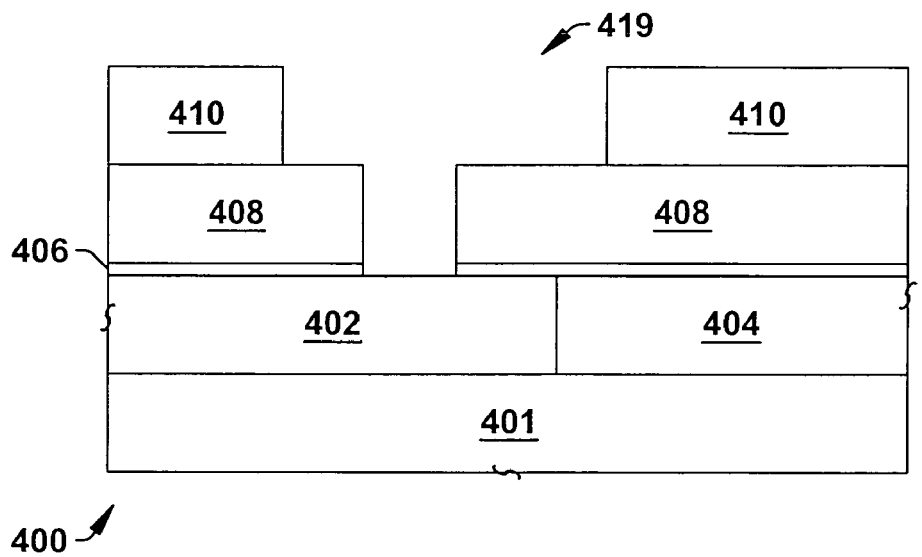

FIG. 4I depicts the semiconductor device 400 at yet another stage of fabrication in accordance with an aspect of the present invention. Here, the via mask has been removed and shows the trench and via cavities 419 formed therein.

Figure 4J:
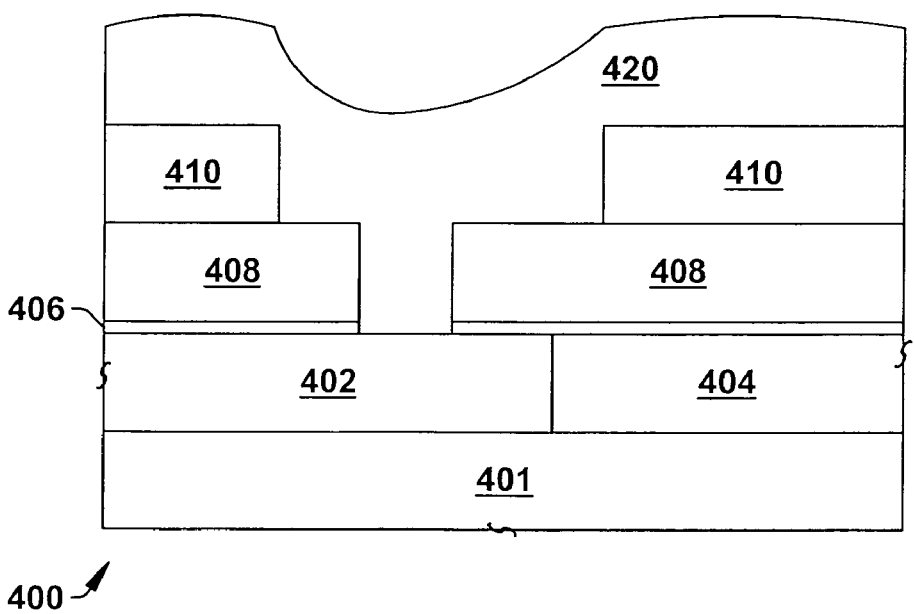

The trench and via cavities 419 are filled with a conductive material 420 as illustrated in FIG. 4J. Substantial conductive fill material, such as copper, is deposited to sufficiently fill the trench and via cavities 419. One or more barrier layers (not shown) can be formed on sidewalls and surfaces of the trench and via cavities 419 prior to depositing the conductive fill material. A suitable deposition or formation process for the conductive material is then employed to deposit or form the fill material to completely fill the trench and via cavities 419.

A number of suitable processes can be employed to fill the cavities with conductive material. In one example, a copper electrochemical deposition process is employed to form the conductive material 420. A copper seed layer is initially formed over the device 400. Then, a three step low acid copper electrochemical deposition process is performed. The device 400 is placed in a plating solution with an applied current, typically a direct current. Plating occurs in three steps using a different plating current at each step to control the deposition rate and quality.

Some examples of suitable deposition mechanisms include electrochemical deposition (ECD), electroless deposition (e-less dep), chemical vapor deposition (CVD), and physical vapor deposition (PVD).

Figure 4K:
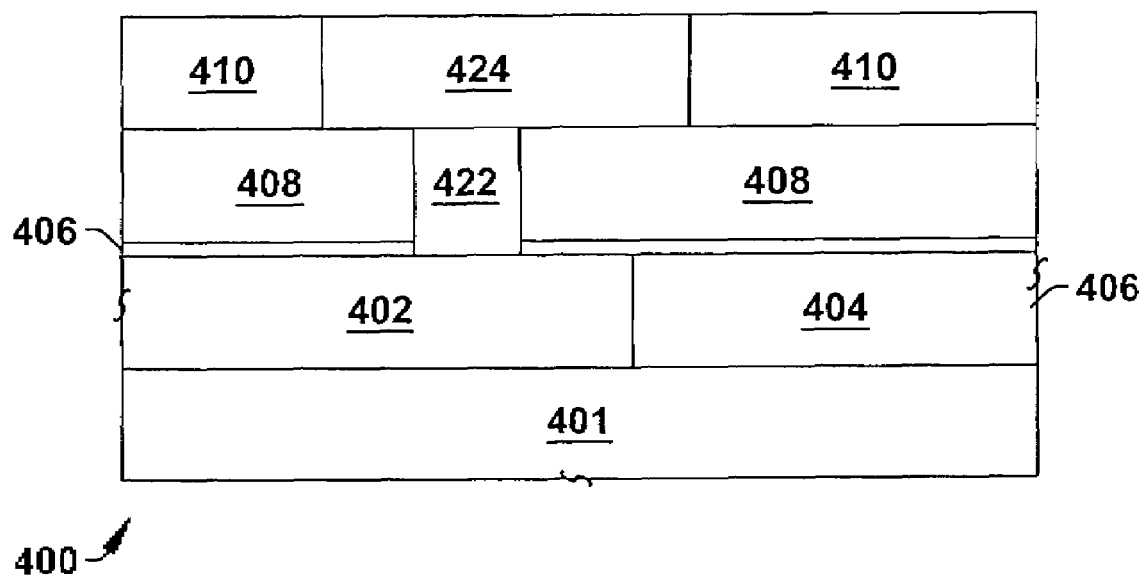

FIG. 4K depicts the semiconductor device 400 at yet another stage of fabrication in accordance with an aspect of the present invention. In order to sufficiently fill the trench and via cavities 419, excess conductive fill material remains on an upper surface of the second dielectric layer and above the trench and via cavities. A planarization process is performed to remove the excess conductive material and define a conductive trench region or feature 424 and a conductive via region or feature 422. The planarization process also electrically isolates the trench region 424 and the via feature 422 from other conductive features (not shown). Additional metallization layers and/or packaging can subsequently be performed to complete fabrication of the semiconductor device 400.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method of fabricating a semiconductor device comprising:
    forming a first dielectric layer having an etch rate at an initial value over a semiconductor body;
    selectively altering the etch rate of the first dielectric layer to an altered value by employing an energy based process that results in the altered value being lower than the initial value;
    forming a second dielectric layer on the first dielectric layer having the altered etch rate value, the second dielectric layer having an etch rate at an initial value; and
    selectively etching the second dielectric layer to form at least one etched region within the second dielectric layer, wherein the initial value of the etch rate of the second dielectric layer is higher than the altered value of the etch rate of the first dielectric layer, and
    wherein the initial etch rate value for the second dielectric layer is substantially similar to the initial etch rate value of the first dielectric layer.

2. The method of claim 1, further comprising selectively etching the first dielectric layer to form at least one additional etch region within the first dielectric layer.

3. The method of claim 1, further comprising selectively altering etch rate uniformity of the dielectric layer.

4. The method of claim 1, wherein selectively altering the etch rate comprises performing an electron beam process on the first dielectric layer.

5. The method of claim 4, wherein performing the electron beam process comprises selecting voltage, current, cure dose, and temperature parameters according to a desired etch rate and performing the electron beam process according to the selected voltage, current, cure dose, and temperature parameters.

6. The method of claim 1, wherein selectively altering the etch rate comprises performing an ultraviolet process on the first dielectric layer.

7. The method of claim 6, wherein performing the ultraviolet process comprises selecting process parameters according to a desired etch rate and performing the ultraviolet process according to the selected process parameters.

8. The method of claim 1, further comprising selectively altering the etch rate of the second dielectric layer to a second altered value.

9. A method of fabricating a semiconductor device comprising:
    forming a first dielectric layer having an etch rate at an initial value over a semiconductor body;
    selectively altering the etch rate of the first dielectric layer to a first altered value by employing an energy based process that results in the first altered etch rate value of the first dielectric layer being lower than the initial etch rate value of the first dielectric layer;
    forming a second dielectric layer having an etch rate at an initial value, the second dielectric being formed on the first dielectric layer having the first altered etch rate value;
    selectively altering an etch rate of the second dielectric layer to a second altered value;
    selectively etching the second dielectric layer at the second altered etch rate to form a trench within the second dielectric layer; and
    selectively etching the first dielectric layer at the first altered etch rate to form a via within the first dielectric layer,
    wherein the initial etch rate value for the second dielectric layer is substantially similar to the initial etch rate value of the first dielectric layer.

10. The method of claim 9, further comprising altering an etch rate uniformity of the first dielectric layer prior to selectively etching the second dielectric layer.

11. The method of claim 9, wherein selective altering the etch rate of the first dielectric layer comprises performing an electron beam process.

12. The method of claim 11, wherein performing the electron beam process comprises selecting voltage, current, cure dose, and temperature parameters according to as desired etch rate of the first dielectric layer and performing the electron beam process according to the selected voltage, current, cure dose, and temperature parameters.

13. The method of claim 11, wherein selectively altering the etch rate of the second dielectric layer comprises performing a second electron beam process.

14. The method of claim 9, wherein selectively altering the etch rate of the second dielectric layer comprises performing an ultraviolet process.

15. The method of claim 14, wherein performing the ultraviolet process comprises selecting process parameters according to a desired etch rate of the second dielectric layer and performing the ultraviolet process according to the selected process parameters.

16. The method of claim 9, further comprising forming a metallic barrier layer on sidewalls and bottom surfaces of the trench and via.

17. The method of claim 16, further comprising filling the trench and via with a conductive material.

18. The method of claim 9, further comprising forming a metal interconnect layer over the semiconductor body prior to forming the first dielectric layer.

19. A method of fabricating a semiconductor device comprising:
    forming a first dielectric layer having an etch rate at an initial value over a semiconductor body;
    selectively altering the etch rate of the first dielectric layer to an altered value;

forming a second dielectric layer having an etch rate at an initial value; and selectively etching the second dielectric layer to form at least one etched region within the second dielectric layer, wherein the initial value of the etch rate of the second dielectric layer is higher than the altered value of the etch rate of the first dielectric layer, and wherein selectively altering the etch rate of the first dielectric layer comprises employing a photoresist mask to alter the etch rate for only selected portions of the first dielectric layer.

* * * * *